United States Patent [19]
Middlehurst et al.

[11] Patent Number: 5,399,104
[45] Date of Patent: Mar. 21, 1995

[54] SOCKET FOR MULTI-LEAD INTEGRATED CIRCUIT PACKAGES

[75] Inventors: Richard J. Middlehurst; Michael K. Knight, both of Fremont, Calif.

[73] Assignee: McKenzie Socket Technology, Inc., Fremont, Calif.

[21] Appl. No.: 951,906

[22] Filed: Sep. 28, 1992

[51] Int. Cl.$^6$ .......................................... H01R 13/648
[52] U.S. Cl. .................................. 439/608; 439/931; 29/846
[58] Field of Search ................. 439/92, 101, 108, 607, 439/608, 609, 931; 29/842, 845, 846

[56] References Cited

U.S. PATENT DOCUMENTS

| | | | |
|---|---|---|---|
| 3,034,087 | 5/1962 | Bohannon, Jr. | 439/931 X |
| 4,858,313 | 8/1989 | Bowlin | 439/608 X |
| 4,902,235 | 2/1990 | Tonooka | 439/931 X |
| 5,037,332 | 8/1991 | Wilson | 439/608 |
| 5,044,992 | 9/1991 | Dzwonczyk et al. | 439/931 X |
| 5,102,352 | 4/1992 | Arisaka | 439/608 |
| 5,211,567 | 5/1993 | Neumann et al. | 439/608 X |

Primary Examiner—Khiem Nguyen
Attorney, Agent, or Firm—Spensley Horn Jubas & Lubitz

[57] ABSTRACT

A socket and a method for making a socket for securing an integrated circuit package to a supporting structure. The integrated circuit package has a plurality of leads positioned in a geometric pattern and each lead has a predetermined impedance. The socket comprises a substrate or body having a first and second surface opposed to each other and formed of an insulative material. The socket further comprises a plurality signal path members extending from at least the first surface to the second surface. Each signal path member includes a first and second end. One end of each signal path member includes a means positioned to secure a lead of an integrated circuit package and the other end is adapted to be coupled to a conductor on a printed circuit board. A metal pattern or ground plane mesh is defined on at least a surface of the substrate, and coated through holes are defined in the substrate at a predetermined distance such that the impedance of at least one signal path is controlled to match the anticipated impedance of the lead. Further, radio-frequency interference with at least one signal path is suppressed.

30 Claims, 4 Drawing Sheets

SOCKET FOR MULTI-LEAD INTEGRATED CIRCUIT PACKAGES

FIELD OF THE INVENTION

This invention relates generally to integrated circuit package sockets. More particularly, this invention relates to a socket and a method for making a socket for use with high speed integrated circuits.

BACKGROUND OF THE INVENTION

Presently, integrated circuits, such as microprocessors, are being designed with faster clock rates. For example, "high speed" integrated circuit packages operating at 33 MHz, or at pulse rise times in the order of 1 to 5 nanoseconds are now commercially available and widely used.

Many different types of integrated circuit package sockets are commercially available that cater to a variety of types of integrated circuit packages typically with J-leads and gull-wing leads and configured for QFP, PLCC, DIP and similar type lead formats. While adequate for conventional lower speed integrated circuits, these prior art sockets fail to suppress radio frequency interference produced by higher speed circuits. Such radio frequency interference may result in faulty signals, disrupt clock synchronization and cause the circuit or the system to malfunction.

Another disadvantage of conventional sockets with respect to higher speed circuits is that the signal paths provided by these sockets are not impedance matched to the integrated circuit leads with which they are used. Hence, these sockets fail to provide maximum power transfer from one high frequency circuit to another. These prior art sockets may also cause current and voltage waves to be reflected within signal paths which, in turn, may result in time delays in signal transmission.

SUMMARY OF THE INVENTION

To overcome the aforementioned problems and disadvantages, the present invention, in its broadest sense, provides a integrated circuit package socket and a method of manufacturing the socket, wherein the socket suppresses radio frequency interference and provides improved impedance matched signal paths from the integrated circuit package to the circuit board.

The socket of the present invention is for securing an integrated circuit package having a plurality of leads to a conductive terminal in a printed circuit board which has at least one ground connection. The socket essentially comprises an insulative body or substrate having a first and second surface opposed to each other. The body includes a plurality of contacts forming signal paths extending from at least the first surface to the second surface for allowing signals to be transmitted between the integrated circuit and the circuit board. The body also includes a conductive coating or metal pattern located on at least a surface of the body at a predetermined distance from at least one of the signal paths such that the signal traveling along that path is effectively shielded from radio frequency interference from other signals. The body may also define a plurality of metallically coated through holes extending from at least the first surface to the second surface and which are electrically connected to the conductive coating in order to suppress further radio frequency interference between at least two signal paths.

The method of the present invention comprises the steps of forming a substrate having a first and second surface. The substrate also includes a first and second group of holes extending from at least the first to the second surface. The first and second surfaces are covered with a conductive mesh which surrounds and is distanced from the first plurality of holes. The interior surfaces formed by the second plurality of holes are coated with a conductive material to form conductive through holes and to electrically connect the two surface meshes to each other. A plurality of signal path elements are inserted and affixed into the first plurality of holes. Each signal path pin has a first end which includes a means positioned to secure or contact a lead of a integrated circuit and a second end which includes a signal pin to electrically engage a conductive terminal in or on a printed circuit board. The signal path elements will be surrounded by the two conductive surface meshes and the through holes electrically couple the meshes on the surface via a conductive coating. One or more ground pins may be inserted into and electrically connected to the coating of at least one hole of the second plurality of holes. The ground pin is of the appropriate type for connection to a ground connection of a printed circuit board.

Other objects and features of the present invention will become better understood by reference to the following detailed description when taken in conjunction with the accompanying drawings.

DETAILED DESCRIPTION OF THE INVENTION

Throughout this description, the preferred embodiment and examples shown should be considered as exemplars, rather than limitations on the structure and method of the present invention.

Figure 1:
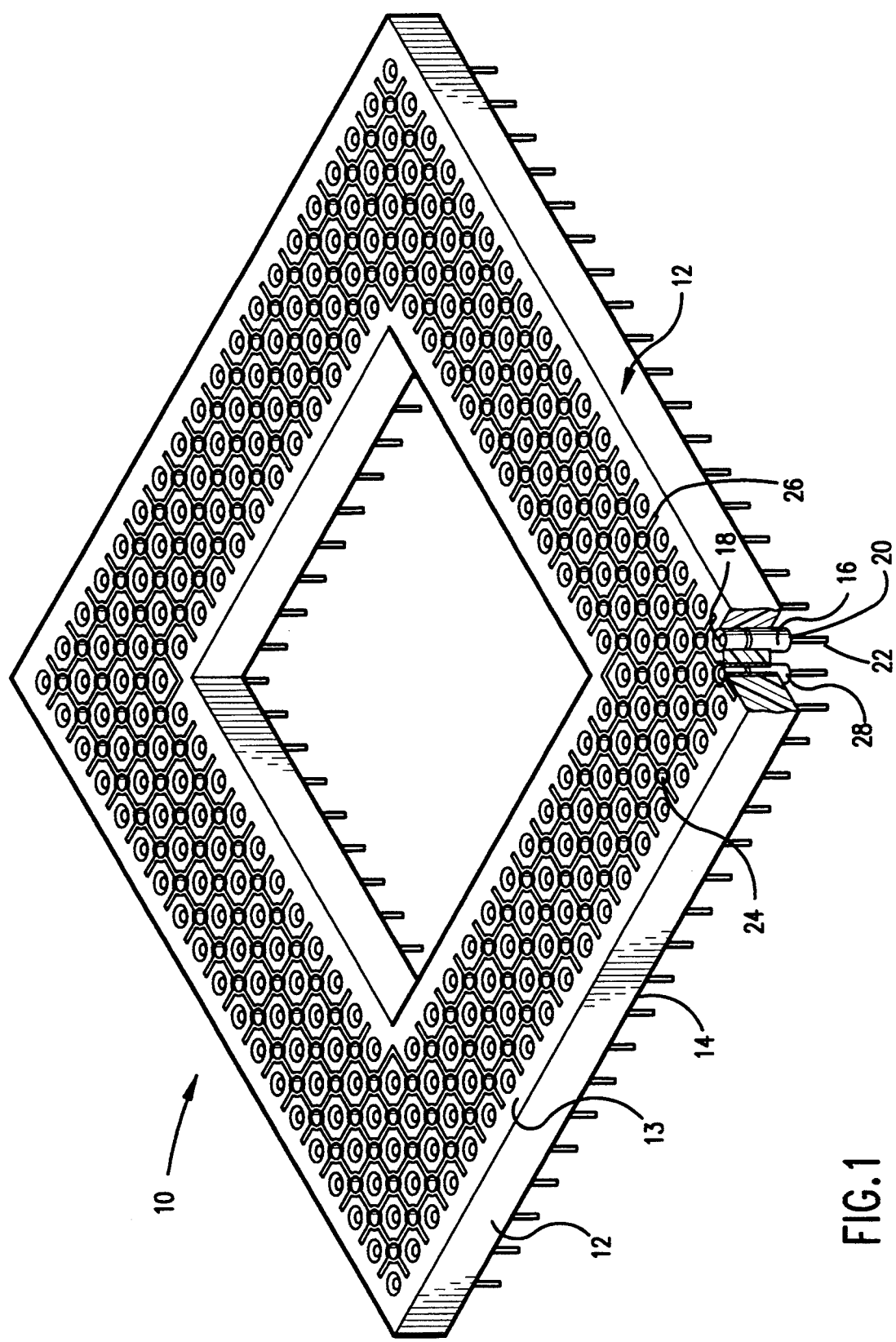
FIG. 1 is a perspective view of one embodiment of the socket of the present invention.
Figure 2:
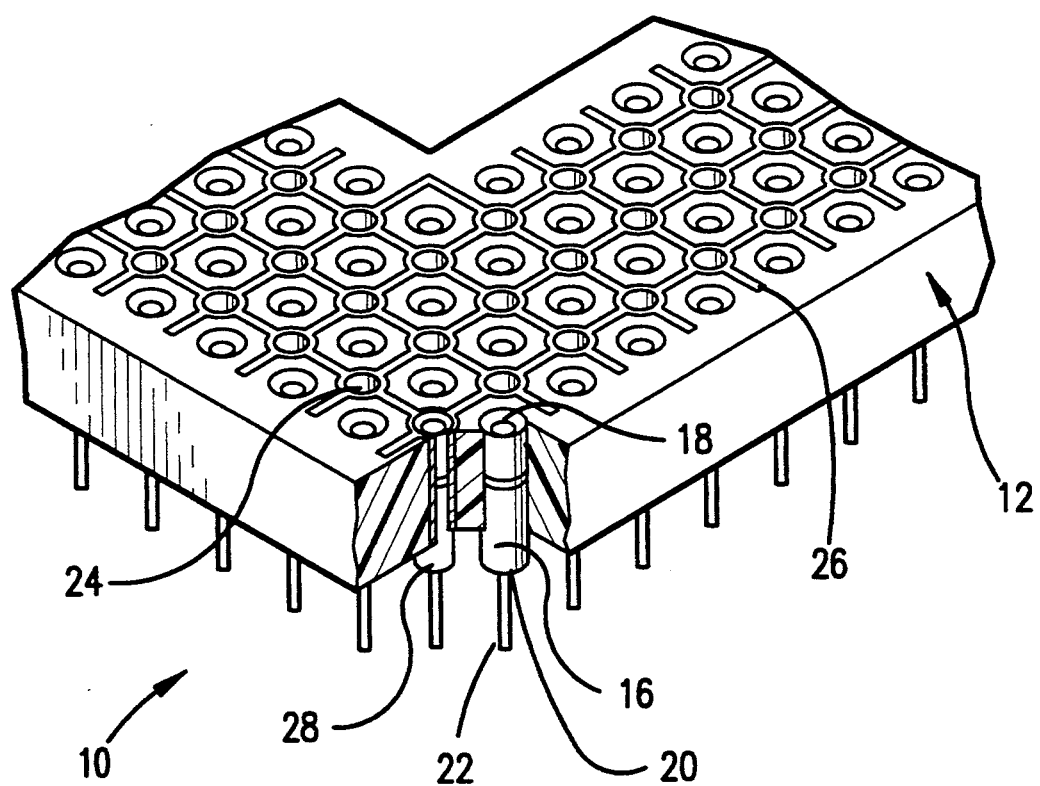
FIG. 2 is a partial perspective cutaway view of the socket of the present invention.

FIGS. 1 and 2 show a perspective view of one embodiment 10 of a socket of the present invention intended for use with a pin grid array integrated circuit package. The socket 10 comprises an insulative body or substrate 12 having a first 13 and second 14 surface opposed to each other. The body 12 preferably has a thickness ranging from 0.110 to about 0.120 inches and may be made of a molded, high temperature plastic material. Preferably, the body 12 is made of polyphenylene sulphide ("PPS") having a dielectric constant ranging from about 2.9 to 4.5, and more preferably 4.0±0.5, depending on the grade. In the present invention, the grade of PPS used is 1140L, which is manufactured by Hoescht Celanese of Chatham, New Jersey. Alternatively, liquid crystal polymer ("LCP") having a dielectric constant ranging from 3.7 to 11.0, and more preferably 4.0±0.5, depending on the grade, is used to make the body 12. For example, the body 12 of the present invention may be made of LCP C810 or C130, which are also manufactured by Hoescht Celanese of Chatham, New Jersey. Alternatively, the body 12 may also be constructed from fiberglass or FR4 printed circuit board material, for example.

In FIGS. 1 and 2, the body 12 of the present invention includes a plurality of signal path elements 16 for allowing signals to be transmitted between an integrated circuit package (not shown) to a terminal in or on a printed circuit board or supporting structure (not shown). The integrated circuit package preferably has a plurality of leads positioned in a geometric pattern, and each lead has a predetermined impedance or lies within a impedance range. The printed circuit board or supporting structure defines a plurality of terminals, at least one of which is a ground path to be coupled to a ground.

Each signal path element 16, as shown in FIGS. 1-4, is generally tubular in shape and is constructed of a highly conductive metal. However, signal path elements having other shapes may be used depending upon the type of integrated circuit package to be mounted on the socket. Preferably, each signal path element 16 is made of a highly conductive copper alloy to obtain high conductivity and to substantially resist corrosion.

The diameter of each signal path element 16 is approximately .0580±0.0005 inches. The diameter of each signal path element 16 may, however, vary in size depending on the dimensions of the leads of the integrated circuit package and the terminals of the printed circuit board. Preferably, each signal path 16 is spaced apart from each other at a distance of no less than about 0.04 inches.

The signal path members 16 can be arranged in any manner or pattern so long as they are able to engage the leads of an integrated circuit package and the corresponding contacts or terminals of a printed circuit board (not shown). In the depicted embodiment 10, the signal path elements 16 are arranged in a matrix pattern that matches the matrix of pins on a pin grid array device. Other suitable sockets and signal paths, nevertheless, may be used for single in-line package modules, dual in-line package modules and other integrated circuit packages having J leads and gull wing leads.

In a socket 10 for a pin grid array device, each signal path element 16 includes a first female end 18 including a means positioned to secure and electrically engage a lead pin of an integrated circuit package (not shown). Each signal path element 16 also includes a second male end 20 defining a signal pin 22 opposite to and integral with the first end 18. Each signal pin 22 of each signal path element 16 allows the socket 10 to be connected electrically to and be secured to a conductive terminal in or on the printed circuit board.

The body 12 of the present invention also defines a plurality of through holes 24 or other metallic members, extending from at least the first 13 to the second 14 surface. The holes 24 are generally tubular in shape and define an inner surface that is preferably coated, covered or plated with a highly conductive metal such as a copper alloy. With the coating, each through hole 24 preferably has an inner diameter of about .055 inches. The center of each through hole 24 is spaced apart from the center of its adjacent signal path elements 16 at a distance of about 0.070 inches.

The through holes 24 are electrically connected to a conductive coating, plating, covering, or metal mesh or grid pattern 26 which is defined on at least one surface 13 or 14 of the body or substrate 12. Preferably, the metal mesh or grid pattern 26 is located on both the first 13 and second 14 surfaces of the body 12 and is arranged in a grid pattern spaced apart from the signal path pins 16. More preferably, the metal mesh or grid pattern 26 forms a ground plane mesh substantially surrounding and isolating the signal path elements 16. In addition, in this embodiment, the distance between the parallel portions of the grid pattern should be about 0.080 inches.

Figure 4:
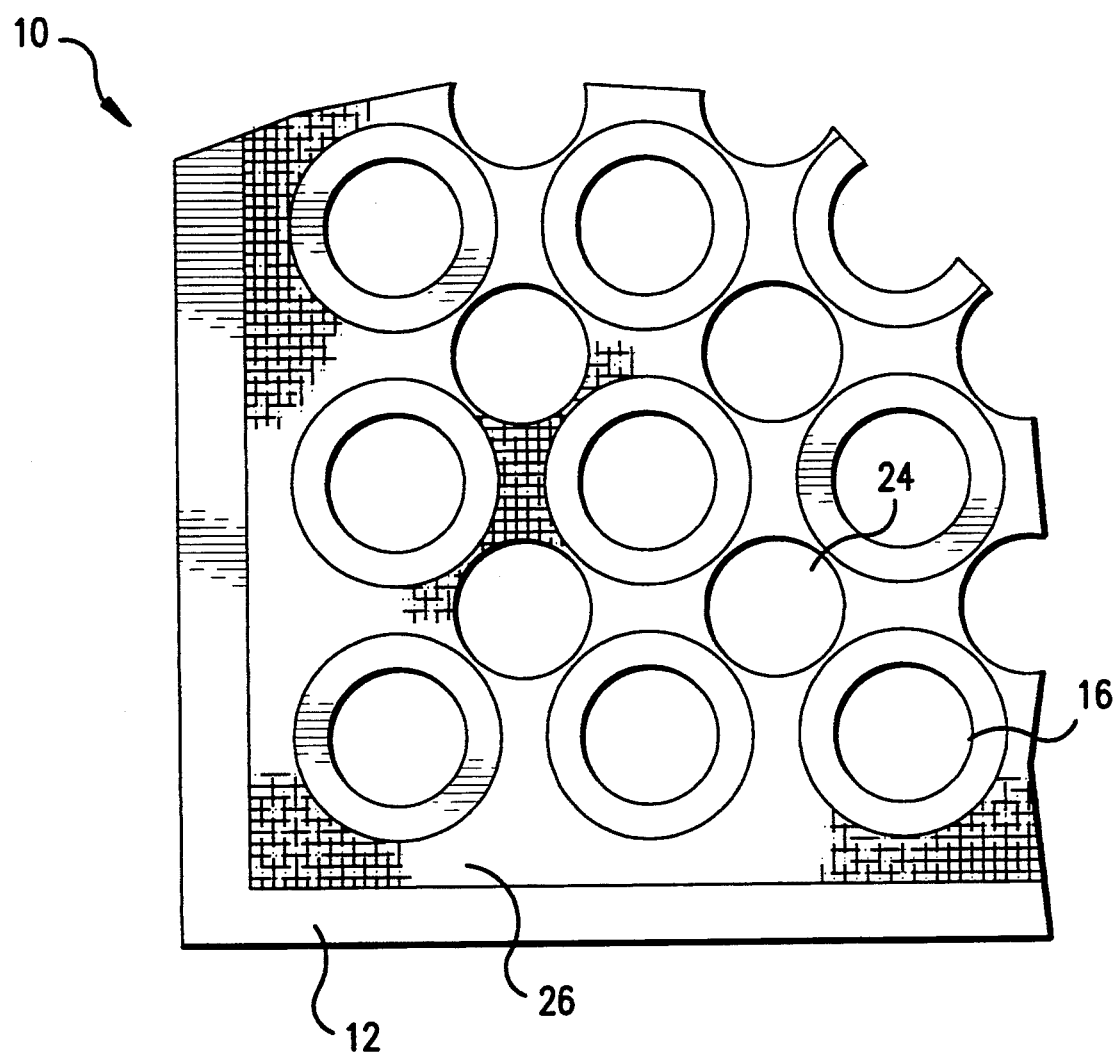
FIG. 4 is an overhead cutaway view of another embodiment of the socket of the present invention.

In yet an alternative embodiment, instead of being arranged in a grid pattern, the metal mesh or grid pattern 26 may substantially cover at least an entire surface 13 or 14 of the body or substrate 12, as shown in FIG. 4. Further, the metal mesh or grid pattern 26 is in contact with and entirely surrounds the through holes 24 but does not contact the signal path elements 16. Thus, the coated through holes 24 create ground paths between the metal mesh or grid patterns 26 located on the first and second surfaces, 13 and 14, respectively.

Preferably, the width of a line in the metal mesh or grid pattern 26, is about .020 inches in width. Also, it is desired that the coating 26 possess a thickness ranging from one to two thousandths of an inch. This coating is preferably comprised of three layers of metal: a bottom layer of copper about 1.4 thousandths of an inch thick, a middle layer of nickel about 5 millionths of an inch thick and a top layer of gold about 5 millionths of an inch thick. Alternatively, combinations of tin and lead may also be used.

In addition, the socket 10 of present invention may include at least one ground pin 28 preferably located in and conductively connected to a coated through hole 24. The ground pin 28 is adapted to engage a grounded terminal on a printed circuit board (not shown). The ground pin 28 allows the electrical energy "captured" by the metal mesh or grid pattern 26 and through holes 24 to be properly grounded. One ground pin 28 may be sufficient to ground any stray electrical energy radiated from the signal path pins 16. Depending on the amount of electrical energy transmitted or radiated from the signal path pins 22, more than one ground pin 28 may be used. Thus, for securing an integrated circuit package having N (an integer) leads, the socket 10 may have at least N+1 connections for coupling the signal path elements 16 and ground pin to terminals on the printed circuit board.

Alternatively, the metal mesh or grid pattern 26 may be electrically coupled to a signal path element 16, which in turn, will be coupled to the ground lead of the integrated circuit package.

Optimally, the conductive coating mesh 26 and the coated through holes 24 should be spaced apart at a predetermined distance from at least one of the signal path elements 16. The distance is selected so that the impedance of the signal path elements 16 is controlled to more closely match the expected range for the impedance of the respective lead to be secured at the female end. With respect to the dimensions discussed above, the socket 10 of the present invention, at 50 MHz is capable of matching impedances of 130 $\Omega$. The socket 10 of the invention, however, is not to be limited to matching impedances of about 130 $\Omega$. For example, depending on the frequency of the circuit, the dielectric constant of the socket body 12 material, dimensions of the body and metallic parts, and manufacturing tolerances, the signal path impedance for the socket may be kept in a controlled range such as ranging from about 35 to about 130 $\Omega$.

Figure 3:
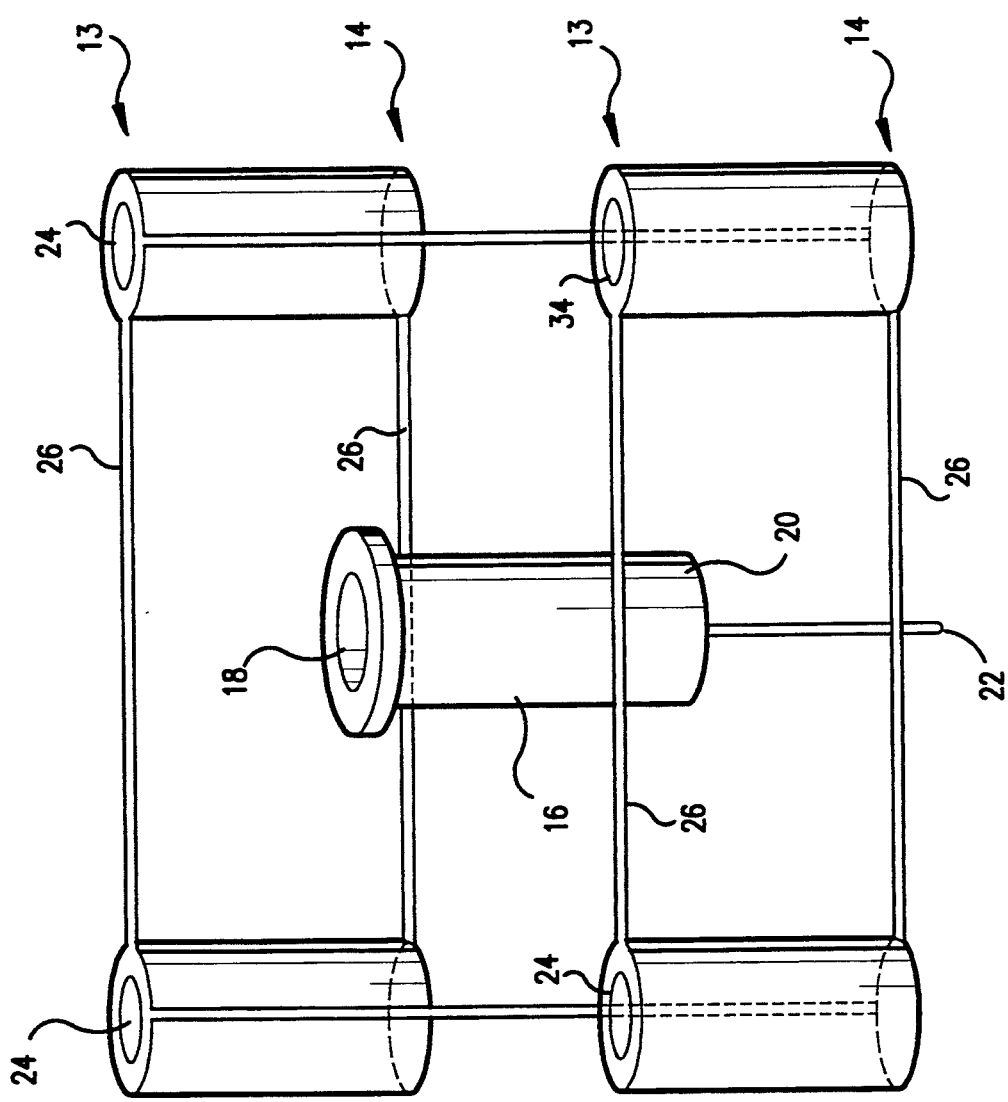
FIG. 3 is a view showing the relative spacing of a signal path element, the surrounding through holes and the mesh in an embodiment of the present invention.

Because the conductive coating mesh 26 and through holes 24 are spaced apart from the signal path elements 16 and grounded when installed on a printed circuit board, each signal path element 16 is in effect the core of a coaxial cable as shown in FIG. 3. To enable this "coaxial effect" to have impedance matching, the distance separating the conductive plating mesh 26 and through holes 24 from the signal path elements 16 varies with the dielectric constant of the material. The appropriate distance may be experimentally determined. By controlling this coaxial effect, the impedance of the signal paths is within the range of the impedances of the leads of the integrated circuit package resulting in the reduction of reflecting of signals.

Further, the metal mesh or grid pattern 26, in combination with the through holes 24, suppresses spurious radiation of radio frequency interference from the signal path elements 16. Hence the amount of radio frequency interference picked up by adjacent circuits or signal path elements 16 through the insulative body 12 is substantially reduced. In effect, the metal mesh or grid pattern 26 in combination with the through holes 24 suppresses radiation of spurious electric signals by signal path elements 16.

Also embodied in the present invention is a method of manufacturing the socket 10 described above. The method of the present invention essentially comprises the steps of forming a body 12 having a first 13 and second 14 surface opposed to each other and creating conductive meshes on these surface. The body 12, typically, has a thickness of between about 0.040 and 0.250 inches.

The body 12 can be made of any insulative material such as plastic, fiberglass or FR4 printed circuit board material. Preferably, however, the body 12 is made of a molded, high temperature plastic material such as PPS or LCP, as described above, and may be formed, for example, by injection molding.

Further, the body 12 is formed to define a first and second 24 plurality of holes which extend from the first 13 to the second 14 surface of the body 12. The first and second 24 plurality of holes are, preferably, arranged in separate matrix patterns as shown in FIGS. 1, 2 and 4.

After forming the body 12, at least one surface of the substrate 12 is covered, coated or plated with a metal mesh 26 or grid pattern 26 which surrounds and is distanced from the first plurality of holes. Preferably, the patterns 26 cover both the first 13 and second 14 surfaces of the substrate 12 and are arranged in a grid or matrix pattern. This metal mesh or grid pattern 26, however, may be such that it substantially covers at least an entire section a surface of the body, as shown in FIG. 4 except for small regions surrounding each of the first plurality of holes. The metal mesh or grid pattern 26 are also made of a conductive material such as a copper alloy or of combinations of copper, nickel and gold or of tin and lead as set forth above.

The second plurality of holes 24 are coated with a conductive material to electrically connect the metal meshes or grid patterns 26 to each other by way of the second plurality of holes 24. Preferably, holes 24 are coated with a highly conductive copper alloy.

A plurality of signal path elements 16 are inserted and affixed into the first plurality of holes. Each signal path element 16 is preferably tubular in shape and has a first end 18 which includes a means to secure a lead of the integrated circuit package. Each signal path element 16 also includes a second end 20 opposite to and integral with the first end 18. The second end 20 includes a signal pin 22 which electrically engages a terminal in or on a printed circuit board.

Preferably, the metal meshes or grid patterns 26 and holes 24 should be spaced apart at a predetermined distance from at least one of the signal paths 16. Those distances are selected and may vary so that the impedance of the signal paths 16 substantially matches the impedance of the respective lead. For example, in the embodiment shown in FIGS. 1 and 2, the meshes are spaced apart from their adjacent signal path elements 16 at a distance of no less than about 0.011 inches; the center of each hole 24 is spaced apart from its adjacent signal path elements 16 by a distance of about 0.070 inches.

Finally, at least one ground pin 28 may be inserted and electrically connected to and integral with the coating of at least one hole of the second plurality of holes 24 in order to safely disperse any electrical energy radiated from the signal path elements 16.

Although the method of manufacture and shown embodiment of the present invention may be for an integrated circuit package having a pin grid array, it should be understood that the method of manufacture of present invention may be for other types of integrated circuit packages such as dual in line packages, QFP, PLCC using J-leads or gull wing leads.

As a result of the disclosed embodiments, radio frequency interference between signal paths is reduced when using high speed circuitry in sockets. Still further, the reflecting of signals is reduced as the impedance of the signal path is controlled. In addition, the footprint of the socket in the disclosed embodiment is substantially the same as the footprint of prior art sockets so the printed circuit board size does not need to be increased.

While this invention has been particularly shown and described in reference to the preferred embodiments and illustrations, it will be understood by those skilled in the art that changes in form and detail may be made without departing from the spirit and scope of the invention. Accordingly, the present invention is not limited to the specific arrangements described in the foregoing detailed description.

What is claimed is:

1. A socket for securing an integrated circuit package having a plurality of leads corresponding to conductive terminals in a printed circuit board, the socket comprising:

a body consisting essentially of an insulative material having a first and second opposed surfaces, a plurality of signal paths and metal coated through holes separately extending from at least the first to the second surface of said body;

said signal paths each including a member for securing the socket to a terminal in the printed circuit board and to the corresponding lead of the integrated circuit package;

a conductive mesh on each of said first and second surfaces of said body;

said meshes being conductively connected to each other by way of said through holes; and a means for electrically connecting the meshes to a terminal on the printed circuit board;

wherein said meshes are arranged in a grid pattern, substantially surrounding and spaced apart from said signal paths.

2. The socket according to claim 1 wherein said meshes are plated onto said first and second surfaces of said body.

3. The socket according to claim 1 wherein the interior surfaces of the holes are covered with a highly conductive metal.

4. A socket for securing an integrated circuit package having a plurality of leads corresponding to conductive terminals in a printed circuit board, the socket comprising:

a body consisting essentially of an insulative material having a first and second opposed surfaces, a plurality of signal paths and metal coated through holes separately extending from at least the first to the second surface of said body;

said signal paths each including a member for securing the socket to a terminal in the printed circuit board and to the corresponding lead of the integrated circuit package;

a conductive mesh on each of said first and second surfaces of said body; and said meshes being conductively connected to each other by way of said through holes and a means for electrically connected the meshes to a terminal on the printed circuit board;

wherein each individual signal path is substantially electrically isolated from the other signal paths by the through holes and meshes.

5. A socket for securing an integrated circuit package having a plurality of leads arranged in a geometric pattern to corresponding terminals of a printed circuit board arranged in a geometric pattern, the socket comprising:

an insulative body of a molded, high temperature plastic material, the body having a plurality of signal path elements extending across the body and arranged in a pattern enabling each signal path to align with and engage one lead of the integrated circuit package and a terminal of the printed circuit board;

said body defining a plurality of electrically conductive through members extending through the body;

a ground plane mesh located on the said body arranged in a grid pattern;

said mesh being electrically coupled to said through members to create a coaxial effect with the signal path elements; and a means to electrically couple the through members to a ground terminal on the circuit board;

wherein said through members are holes defined by the body to provide interior surfaces and the interior surfaces are coated with a highly conductive copper alloy.

6. The socket for an integrated circuit package having a plurality of leads and a printed circuit board having at least one ground terminal, the socket comprising:

an insulative body having at least one surface;

said body including a plurality of signal path elements extending through said body;

said body including a plurality of metallic elements separate and distanced from said signal paths, and extending through said body;

said body including conductive plating on said surface arranged in a grid pattern, thereby forming a ground plane mesh which electrically isolates and surrounds said signal paths elements;

said mesh located on said surface of said body being electrically connected to said metallic elements;

a means for coupling the mesh to the ground terminal on the circuit board;

said signal path includes a first end for electrically engaging a lead of the integrated circuit package and a second end integral with an opposed to said first end for electrically engaging conductive terminals of a printed circuit board;

wherein said metallic elements are plated, tubular through holes to provide a co-axial effect for each signal path.

7. The socket according to claim 6 wherein said body is made of a molded, high temperature plastic.

8. The socket according to claim 6 wherein said signal paths are arranged in a matrix pattern.

9. The socket according to claim 6 wherein each said signal path includes a first end for electrically engaging a lead of the integrated circuit package and a second end integral with and opposed to said first end for electrically engaging conductive terminals of a printed circuit board.

10. The socket according to claim 9 wherein each said second end of said signal paths includes a signal pin.

11. A method of manufacturing a socket for securing an integrated circuit package having a plurality of leads to a terminal of a printed circuit board, comprising:

forming a substrate having a first and second surface, and defining a first and second plurality of holes extending from said first to said second surface;

covering each of said first and second surfaces of said substrate with conductive meshes which surround and are distanced from at least some of said first plurality of holes;

coating said second plurality of holes with a conductive material to electrically connect said meshes to each other by way of said second plurality of holes; and inserting and affixing a plurality of signal path elements into said first plurality of holes, wherein each said signal path element has a first end which includes a means positioned to secure a lead of an integrated circuit package and a second end having a signal means for electrically engaging the socket to the terminal on a printed circuit board.

12. The method of claim 11, the method further including electrically connecting at least one ground pin to at least one hole of said second plurality of holes.

13. The method according to claim 12 wherein said body is made of a molded, high temperature plastic material.

14. The method according to claim 12 wherein said meshes are arranged in a grid pattern.

15. The method according to claim 12 wherein each signal path element is electrically isolated from the other elements.

16. The method according to claim 12 wherein said second plurality of holes are covered with a highly conductive metal.

17. A socket for securing an integrated circuit package to a supporting structure, the integrated circuit package having a plurality of leads positioned in a geometric pattern and each lead having a predetermined impedance and the supporting structure defining a signal path to be coupled to a ground, the socket comprising:

a substrate having opposed surfaces and formed of an insulative material;

a plurality of signal path members extending between the surfaces, each member including a means positioned to electrically couple to a lead of the integrated circuit package; and a metal pattern defined at least partially on at least a surface of the substrate at a predetermined distance from at least some of the signal path members such that the impedance of said some signal path members is within a range of the impedance of the lead to which the signal path member is to be secured;

wherein said integrated circuit package defines a plurality of plated through holes extending between the first surface to said second surface, each through hole defining an interior surface, and wherein the through holes are spaced from the signal paths such that the impedance substantially matches the impedance of the lead of the package.

18. The socket according to claim 17 wherein said metal pattern is defined on both surfaces.

19. The socket according to claim 18 wherein each through hole defines a conductive path passing through the through hole and said metal pattern on one surface is electrically connected to the metal pattern on the other surface by a conductive path passing through the through holes.

20. The socket according to claim 19 wherein said socket further comprises a means for electrically connecting at least one said through hole to ground.

21. The socket of claim 1, wherein the metal pattern and the Conductive members are spaced apart from the signal paths such that the impedance of each signal paths is within a predetermined range.

22. The socket according to claim 4 wherein a metal pattern is defined on the surface of the substrate a predetermined distance from at least one of the signal paths.

23. The socket according to claim 22 wherein said metal pattern is electrically coupled to said members such that radio-frequency interference between the signal paths is suppressed.

24. The socket according to claim 1 wherein said signal path members contact said insulative material.

25. The socket according to claim 5 wherein said plurality of signal path elements contacts said plastic material.

26. The method of manufacturing a socket according to claim 11 wherein said signal path elements further include a means to contact said substrate.

27. The socket according to claim 17 wherein said plurality of signal path members contacts said insulative material.

28. The socket according to claim 4 wherein said plurality of signal paths contacts said insulative substrate.

29. A socket for securing an integrated circuit package to a supporting structure, the integrated circuit package having a plurality of leads positioned in a geometric pattern and each lead having a predetermined impedance and the supporting structure defining a signal path to be coupled to a voltage potential, the socket comprising:

a substrate having surfaces and formed of an insulative material;

a plurality of signal path members and plated through holes extending between the surfaces, where each signal path member includes a means positioned to electrically couple to a lead of the integrated circuit package and where the through holes are spaced from the signal path members such that the impedance substantially matches the impedance of the lead of the package; and a metal pattern defined at least partially on at least a surface of the substrate at a predetermined distance from at least some of the signal path members such that the impedance of said some signal path [element]members is within a predetermined range of the impedance of the lead to which the signal path is to be secured.

30. A method of manufacturing a socket for securing an integrated circuit package having a plurality of leads to a terminal of a printed circuit board, comprising:

forming a substrate having a first and a second surface, and defining a first and second plurality of holes extending from said first to said second surface, the second set of holes being predetermined distances from the first set of holes;

covering said first and second surfaces of said substrate with a conductive mesh which surrounds and is distanced from at least some of said first plurality of holes;

affixing a plurality of signal path elements into said first plurality of holes, wherein each said signal path elements has a first end which includes a means positioned to secure a lead for an integrated circuit package and a second end having a signal pin for electrically engaging and securing the socket to the terminal on a printed circuit board;

coating said second plurality of holes with a conductive material to electrically connect said meshes to each other by way of said second plurality of holes, such that the predetermined distances of the second plurality of holes are spaced from the first set of holes containing the signal path [members]elements such that the impedance will substantially match the impedance of the lead of the integrated circuit package.

* * * * *